(12) United States Patent
Chen et al.

(10) Patent No.: US 7,111,275 B2
(45) Date of Patent: Sep. 19, 2006

(54) ELECTRONIC CIRCUIT DESIGN ANALYSIS SYSTEM

(75) Inventors: Thaddeus Chen, Wappingers Falls, NY (US); Zhaoqing Chen, Poughkeepsie, NY (US); Hubert Harrer, Schoenaich (DE); Jan Elizabeth Hoffman, Rochester, MN (US); Susan Marie Karwoski, Rochester, MN (US); Joonsuk Park, Mohegan Lake, NY (US); Stephen Bruce White, Minnesota City, MN (US); John W. Zack, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 10/651,151

(22) Filed: Aug. 28, 2003

(65) Prior Publication Data

US 2005/0050489 A1    Mar. 3, 2005

(51) Int. Cl.
*G06F 17/50* (2006.01)

(52) U.S. Cl. .............................. 716/18; 716/2; 716/12
(58) Field of Classification Search .................. 716/1, 716/2, 7, 12, 18; 703/14; 345/440
See application file for complete search history.

(56) References Cited

U.S. PATENT DOCUMENTS

| 4,656,592 A | * | 4/1987 | Spaanenburg et al. ......... 716/7 |
| 2003/0222872 A1 | * | 12/2003 | Lin et al. .................... 345/440 |
| 2005/0049841 A1 | | 3/2005 | Chen et al. |

* cited by examiner

*Primary Examiner*—Thuan Do
(74) *Attorney, Agent, or Firm*—Wood, Herron & Evans, LLP

(57) ABSTRACT

A method, apparatus and program product generate package files that are separately stored and selectively combined to generate a net file suited for system simulation and analysis. Selective combination of the package files using respective reference connections of each package enables focused and efficient modeling of design performance characteristics.

31 Claims, 3 Drawing Sheets

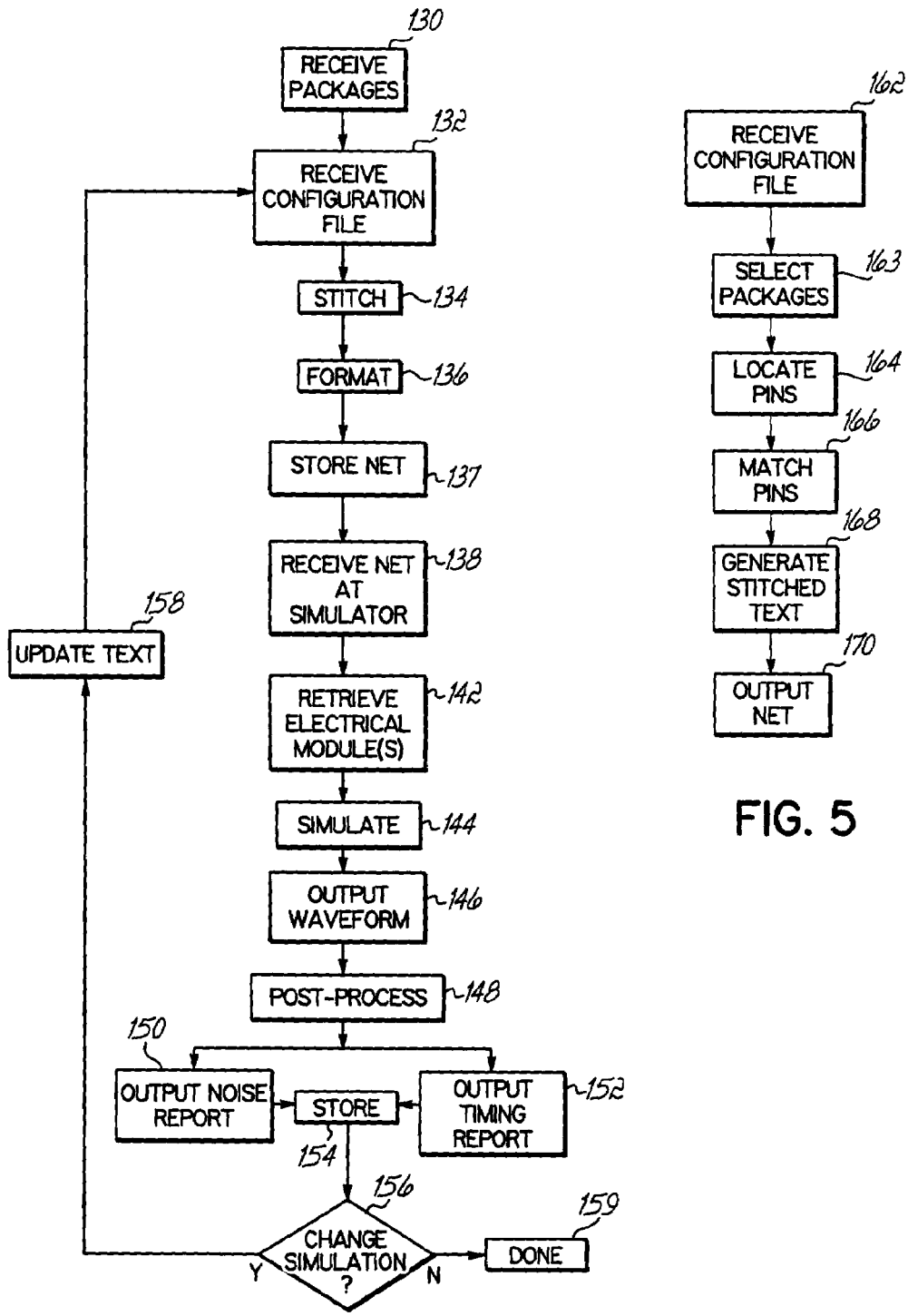

ELECTRONIC CIRCUIT DESIGN ANALYSIS SYSTEM

CROSS-REFERENCE TO RELATED APPLICATION

This application is related to U.S. patent application Ser. No. 10/651,150 filed concurrently herewith on Aug. 28, 2003 by Chen et al. and entitled "Simulation Management System" (ROC920020190US1). The entire disclosure of that U.S. patent application is incorporated into this application by reference.

FIELD OF THE INVENTION

The present invention relates generally to computer operations and applications, and more particularly, to the design and performance analysis of computer systems.

BACKGROUND OF THE INVENTION

Advances in the field of computer and electronic system design continue to drive and facilitate greater processing efficiencies. Through modeling and other analysis, electronic files containing designs for electronic circuits and computer systems are optimized for use as templates for hardware manufacturing and networking. A typical computer/circuit design file includes text that accounts for numerous electronic hardware components. For example, a file containing a design commonly includes programmatic objects and identifiers descriptive of busses, microchips, expansion cards and other system hardware. A bus generally enables selective communication between a computer processor unit (CPU) and one or more components, such as those mounted on an expansion card. A typical bus, such as a Peripheral Component Interconnect or Industry Standard Architecture bus, may additionally couple to a main system circuit board. Expansion cards are typically thin, rectangular printed circuit boards that have connector pins along one edge that couple to corresponding sockets of the bus. Programmatic objects describing such components within the design file may include delay, routing, voltage, resistance, symbol and/or other parameter data.

In operation, actual components of a circuit cooperate to process electronic signals according to system requirements. More particularly, the components interconnect to generate and communicate electronic signals. Different combinations and configurations of components affect system performance. For example, component layout can impact system timing. System timing regards the arrival of a signal at a given component within a predetermined window of time. Each component visited along the path of a signal introduces varying delay that affects the time required for the signal to reach a destination component. Thus, successful timing requires coordination with other signals and signal paths to ensure coordinated system processing. Failure to achieve desired timing can result in processing delays, error and failure.

Another performance factor affected by system design is noise. Noise is characterized as static or interference introduced as the signal travels through system components and connections. As such, the electrical characteristics of the signal change as it propagates through a system. For instance, square wave characteristics of an input signal may become less distinct due to loss dispersion encountered in a system. While some tolerance of noise is typically built into a system design specification, unacceptable noise levels can severely impact signal clarity and system performance. For example, data may become corrupted, e.g., a binary "1" may register as a "0." Designs accommodating high noise levels thus run risk of pervasive error, to include unreliable results, as well as processing failure and delay.

Production of a hardware system represents a substantial investment of material, manpower and other economic resources. Consequently, it is advantageous to verify design integrity prior to committing it to hardware. More particularly, it is desirable to predict or otherwise analyze performance characteristics of a design prior to implementation. To this end, simulation programs, or engines, have been developed to model performance of the programmatic objects of a design. Such modeling practices help to assure conformity with system needs.

Ideally, a simulation engine could process a file containing the entire design, imparting comprehensive performance data to a user in a timely fashion. Due to the massive amounts of components associated with electrical circuit/computer system designs, however, modeling of a comprehensive system and/or network is impractical in terms of modeling every detail of a design. That is, no known simulation engine program can practically model signal flow through a design file that comprehensively addresses all aspects of a system. Processes needed to accomplish such modeling would exceed both processing capacities of known electronic systems, as well as practical time lines of system developers.

To this end, some conventional design processes try to approximate system performance using macrofiles that encapsulate or abstract critical component functionality, and that as a result, are relatively smaller in size. While the relatively smaller size of such macro level files can make simulation more manageable, extreme care and effort must be taken to ensure the macro level files possess the resolution and fidelity necessary to accurately model the system with meaningful veracity. For instance, an improperly constructed macro level file may ignore subtle, less critical components and electrical properties of a system that can nonetheless compromise accuracy in the aggregate. As such, and despite their relatively smaller size, the generation of each macro level file can be a painstaking, error prone and meticulous process that represents a substantial investment of manpower, memory and processing power.

In any case, the practicality and application of macro level files remains undermined by their inherent inflexibility. For instance, each macro level file is unique to a particular design and modeling scenario. As such, an entirely new macro level file must be generated from scratch in response to any design change. Because a typical design session involves frequent design changes, completely new macro level files must be generated numerous times. That is, an entire macro level file must be produced for every contemplated design modification to ensure optimized system performance. Moreover, the inflexibility of the highly structured macro files and associated modeling techniques largely discourages customized, focused and efficient analysis. For instance, a designer interested in the performance of only a portion of a system may nonetheless have to wait and sift through execution and analysis of an entire macro level file. Alternatively, a designer may be relegated to creating a file from scratch that simulates only a portion of interest. In either case, designers must re-accomplish work with sometimes preclusive frequency.

Consequently, and for in part the above delineated reasons, there exists a need for an improved manner of analyzing computer system performance.

SUMMARY OF THE INVENTION

The present invention provides an improved apparatus, method and program product for analyzing a circuit design in a manner that addresses the above-identified problems of conventional systems. In one respect, an embodiment of the present invention relies on logically-linked package files to efficiently abstract data from a circuit design file. The amount of abstracted data is small enough to allow reasonable processing in a simulation context, while still retaining sufficient content to model a performance characteristic. To this end, each package file includes data that is descriptive of a portion of the electrical circuit to be analyzed. Such data may include logical, physical and electrical information. The package files further include respective connection points. These connection points are used to logically link, or stitch, programmatically associated package files to one another.

Stitching of the designated package files is selectively accomplished. This selectivity may translate into more focused and efficient simulation. For instance, a simulation may involve only those package files as are necessary to determine a given performance characteristic. Thus, the amount of data that requires processing for a simulation may be further streamlined. Stitching may be accomplished automatically and/or using operator input.

Individual storage of package files allows changes to particular packages and simulations in a manner that preserves data associated with other package files. That is, only data needing change may be modified, without having to regenerate other existing package files already comprising a net file. Moreover, package and/or net files may be reused during subsequent simulations without requiring regeneration.

By virtue of the foregoing there is thus provided an improved design file analysis mechanism that addresses shortcomings of conventional techniques. These and other objects and advantages of the present invention shall be made apparent in the accompanying drawings and the description thereof.

BRIEF DESCRIPTION OF THE DRAWINGS

The accompanying drawings, which are incorporated in and constitute a part of this specification, illustrate an embodiment of the invention and, together with a general description of the invention given above, and the detailed description of the embodiment given below, serve to explain the principles of the invention.

FIG. 4 is a flowchart having method steps for package file stitching and net file creation consistent with the invention and suited for execution within the system of FIG. 1.

FIG. 5 is flowchart having method steps consistent with the invention and further outlining the stitching processes of FIG. 4.

DETAILED DESCRIPTION OF DRAWINGS

Figure 1:
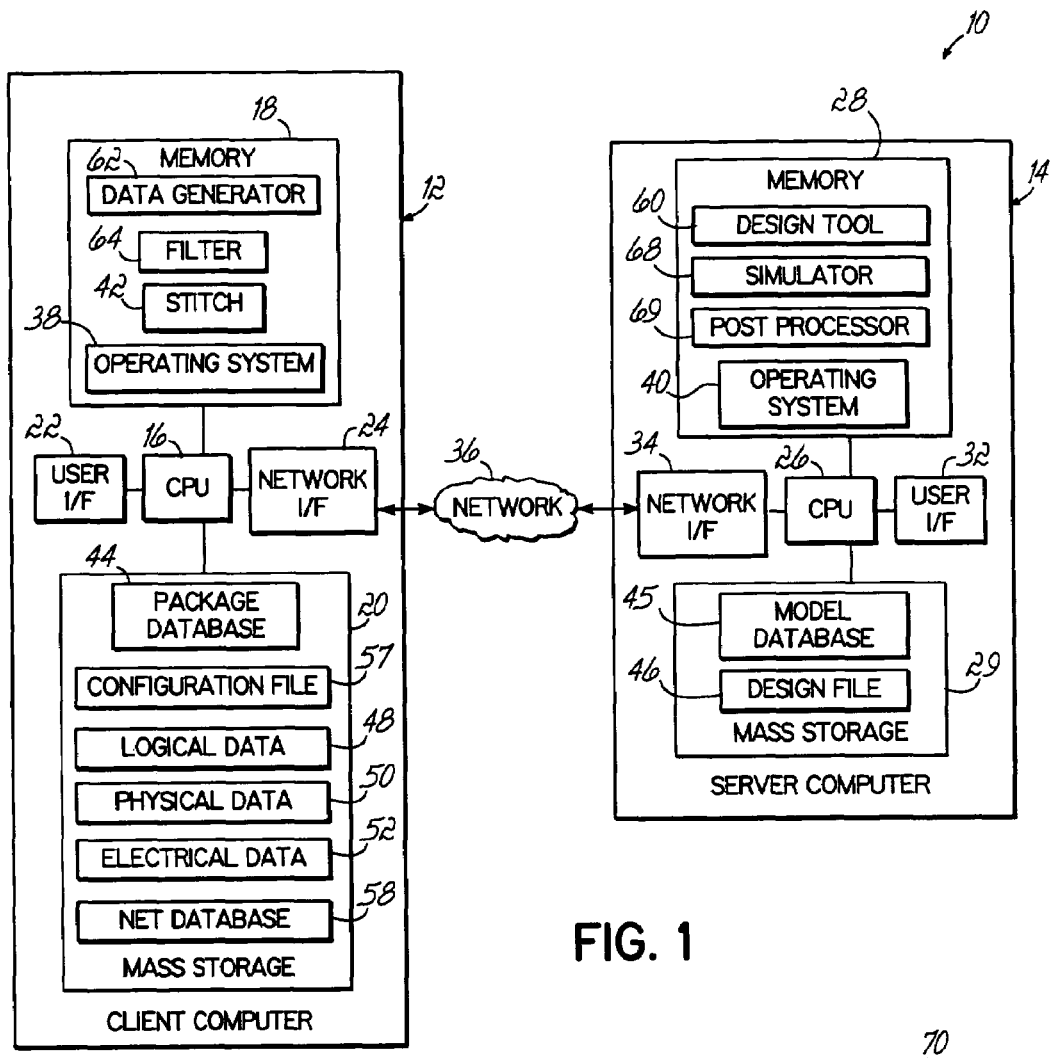
FIG. 1 is a block diagram of a client-server computer system having software consistent with the invention.

With reference generally to the embodiment of FIG. 1, there is shown a system 10 configured to analyze computer system performance. In so doing, the system 10 selectively combines appropriate package files needed to analyze a desired performance parameter, to include timing and noise characteristics. For purposes of this specification, a package file may include code descriptive of and/or relating to a portion of a computer system to be analyzed. For instance, a package file may comprise text that programmatically defines a component, or group of components and connections that affect a path traveled by a signal for a given application.

According to an embodiment that is consistent with the invention, selected package files are logically linked, or stitched, using reference connections defined within each package file to form a composite, net file. A reference connection comprises a logical, electrical and/or physical aspect of a package design useful in identifying a part of a second package design. An exemplary reference connection may include geometric coordinates of a pin connection used to interconnect components. As such, a reference connection of each package file correlates to a respective reference connection of one or more other package files. For instance, the system 10 may rely on textual, programmatic annotations within the generated net file to logically link selected package files along matching pins. A user may thus flexibly configure the net file to account for only those portions of an electrical/computer system design needed for analysis. This feature can limit processing power and time requirements associated with unneeded portions of a design that could otherwise frustrate analysis. For instance, a user may determine a given performance characteristic using only five of thirty thousand package files associated with a given design. Moreover, the system 10 may readily modify net files by adding or deleting files in a manner that does not require regeneration of other existing package files comprising the net file. While designating pins as reference connections may have particular application within certain embodiments that are consistent with the invention, one of skill in the art will appreciate that any number of other suitable designators within a design file may be alternatively used in accordance with the invention, to include any programmatic reference relating to an identifiable design component, logical connection and/or propagating electrical signal.

Turning now to the Drawings, wherein like numbers may denote like parts throughout the several views, FIG. 1 illustrates a client-server based computer system 10 that is consistent with the invention. System 10 includes at least one apparatus, e.g., one or more client computers 12 and one or more server computers 14. For the purposes of the invention, each computer 12, 14 may represent practically any type of computer, computer system or other programmable electronic device capable of functioning as a client and/or server in a client-server environment. Moreover, each computer 12, 14 may be implemented using one or more networked computers, e.g., in a cluster or other distributed computing system. Moreover, as is common in many client-server systems, multiple client computers 12 will typically be interfaced with a given server computer 14. While more capable computer systems may present advantages in certain embodiments consistent with the principles of the present invention, a suitable server 14 for purposes of this specification may comprise any device configured to receive and process an electronic message transmitted from the client computer 12.

Client computer 12 typically includes a central processing unit 16 including at least one microprocessor coupled to a memory 18, which may represent the random access memory (RAM) devices comprising the main storage of computer 12, as well as any supplemental levels of memory, e.g., cache memories, non-volatile or backup memories (e.g., programmable or flash memories), read-only memories, etc. For instance, the computer 12 may include a stitching program 42 configured to retrieve and link appropriate package files according to a system configuration file 57. As described below in greater detail, another program 62 may process a system design file 46 to derive physical, logical and electrical files 48, 50 and 52, respectively. A design tool 60, such as a computer aided design (CAD) program, may be used to generate the design file 46. A filter program 64 of the system 10 may determine what information should will be included within a package per operating and user specifications. In addition, memory 18 may be considered to include memory storage physically located elsewhere in computer 12, e.g., any cache memory in a processor in CPU 16, as well as any storage capacity used as a virtual memory, e.g., as stored on a mass storage device 20 or on another computer coupled to computer 12.

Computer 12 also typically receives a number of inputs and outputs for communicating information externally. For interface with a user or operator, computer 12 typically includes a user interface 22 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 12 may also include one or more mass storage devices 20, e.g., a floppy or other removable disk drive, a hard disk drive, a direct access storage device (DASD), an optical drive (e.g., a CD drive, a DVD drive, etc.), and/or a tape drive, among others. An exemplary mass storage may include a database 44 that contains package files generated from stored logical, physical and electrical files 48, 50 and 52, respectively. As discussed in greater detail below, the system 10 may derive such files 48, 50 and 52 from a system design file 46, shown at server computer 14 for exemplary purposes. Still other examples of storage 20 may include a net database 58 containing nets that for recall and/or combination with other nets as needed. Electrical model information may be retrieved from another database 45 in response to instructions from a processed electrical file 52. Where advantageous, the electrical data/file 52 may include electrical model information. Moreover, one of skill in the art will recognize that the inclusion and distribution of the databases, files and other stored data may be altered substantially while still conforming with the principles of the present invention.

Furthermore, computer 12 may include an interface 24 with one or more networks (e.g., a LAN, a WAN, a wireless network, and/or the Internet, among others) to permit the communication of information with other computers and electronic devices. It should be appreciated that computer 12 typically includes suitable analog and/or digital interfaces between CPU 16 and each of components 18, 20, 22 and 24 as is well known in the art.

Similar to computer 12, computer 14 includes a CPU 26, memory 28, mass storage 29, user interface 32 and network interface 34. However, given the nature of computers 12 and 14 as client and server, in many instances computer 14 will be implemented using a multi-user computer such as a server computer, a midrange computer, a mainframe, etc., while computer 12 will be implemented using a desktop or other single-user computer. As a result, the specifications of the CPU's, memories, mass storage, user interfaces and network interfaces will typically vary between computers 12 and 14. However, one skilled in the art will appreciate that other hardware environments are contemplated within the context of the invention.

Computers 12, 14 are generally interfaced with one another via a network 36, which may be public and/or private, wired and/or wireless, local and/or wide-area, etc. Moreover, network 36 may represent multiple, interconnected networks. In the illustrated embodiment, for example, network 36 may include the Internet.

Each computer 12, 14 operates under the control of an operating system 38, 40 and executes or otherwise relies upon various computer software applications, components, programs, objects, modules, data structures, etc. Moreover, various applications, components, programs, objects, modules, etc. may also execute on one or more processors in another computer coupled to computer 12, 14 via a network, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. For instance, the embodiment of FIG. 1 includes stitching program code 42 configured to selectively link packages into net files as appropriate per an analysis session. Complementary program code may reside on the server 14 side, but one of skill in the art should appreciate that embodiments consistent with the principles of the present invention may nonetheless use program code resident at only one, or any number of locations.

Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of signal bearing media used to actually carry out the distribution. Examples of signal bearing media include but are not limited to recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the exemplary environment illustrated in FIG. 1 is not intended to limit the present invention. Indeed, those skilled in the art will recognize that other alternative hardware and/or software environments may be used without departing from the scope of the invention.

Figure 2:
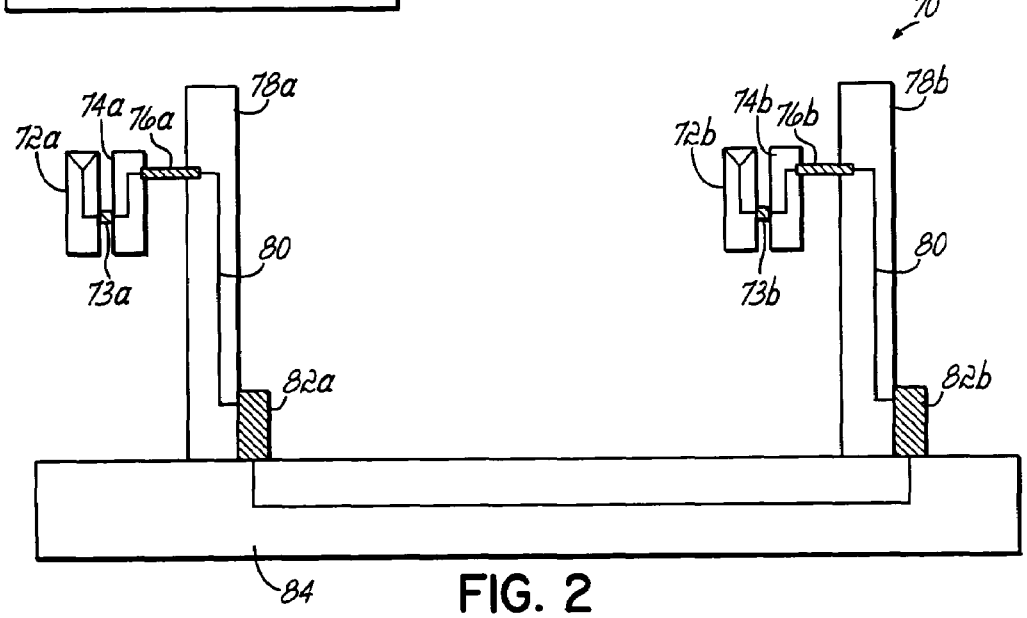
FIG. 2 is a block diagram of an electrical circuit design suited for analysis using the computer system of FIG. 1.

FIG. 2 shows an exemplary electrical circuit design 70 for which a package 44 or net file 58 of FIG. 1 may be generated in accordance with the principles of the present invention. The circuit 70 is shown for illustrative purposes only, and one of skill in the art will appreciate that package and/or net files consistent with the invention may be generated according to hardware environments that comprise much smaller or larger hardware entities. Suitable hardware applications may thus include, for example, the networked computer system 10 of FIG. 1 and/or a portion of a single microchip/driver 72a of FIG. 2, to include transistors on the chip 72a.

As shown in FIG. 2, the system 70 designated for analysis includes hardware positioned along a signal path from a designated driver 72a to a designated receiver 72b. The driver 72a comprises the point of origination of a signal for purposes of a net modeling scenario, and the receiver 72b represents the point of the signal's arrival at its destination within the defined net file. As such, a net and/or package may comprise any hardware and/or software positioned along a path between a driver and a receiver. A net may further comprise multiple packages that each define a portion of a computer system. One of skill in the art will appreciate that typical package files are advantageously designed to be of relatively manageable sizes. The driver 72a of FIG. 2 includes a microchip housed within a module 74a. A typical microchip includes components formed in silicon, such as capacitors, resistors, inductors, connectors and switches. While only one microchip is shown directly connected to the module 74a, one of skill in the art will nonetheless appreciate that a suitable module may alternatively mount multiple microchips.

The driver 72a connects to the module 74a via a pin connector 73a formed from silicon substrate, such as a Controlled Collapse Chip or flip-chip solder-bump connection as is known in the field. Similarly, the module 74a attaches to an expansion card 78a via another connector 76a. The expansion card 78a includes a thin, rectangular printed circuit board that has electrical components such as capacitors, inductors and resistors. The expansion card 78a further includes connector pins (not shown) along one edge that couple to corresponding sockets (not shown) of a main system circuit board 84 and/or a bus 82a. The bus 82a generally enables selective communication between the microchip 72a and (a processor communicating with) the main system board 84. A signal may travel through each of these and other components of the electrical circuit design 70 along a path to the receiver 72b defined by line 80. Of note, the microchip/receiver 72b attaches to a module 74b and the rest of the electrical circuit design 70 (as programmatically defined within the net file) by connector pin 73b. As discussed herein, such pins 73a&b may provide useful reference connections for purposes of stitching packages and other nets. As such, one of skill in the art should appreciate that the electrical circuit design 70 as defined in a net file may include multiple, stitched package files. Accordingly, the electrical circuit design 70 may include many more reference connectors as needed.

Figure 3:
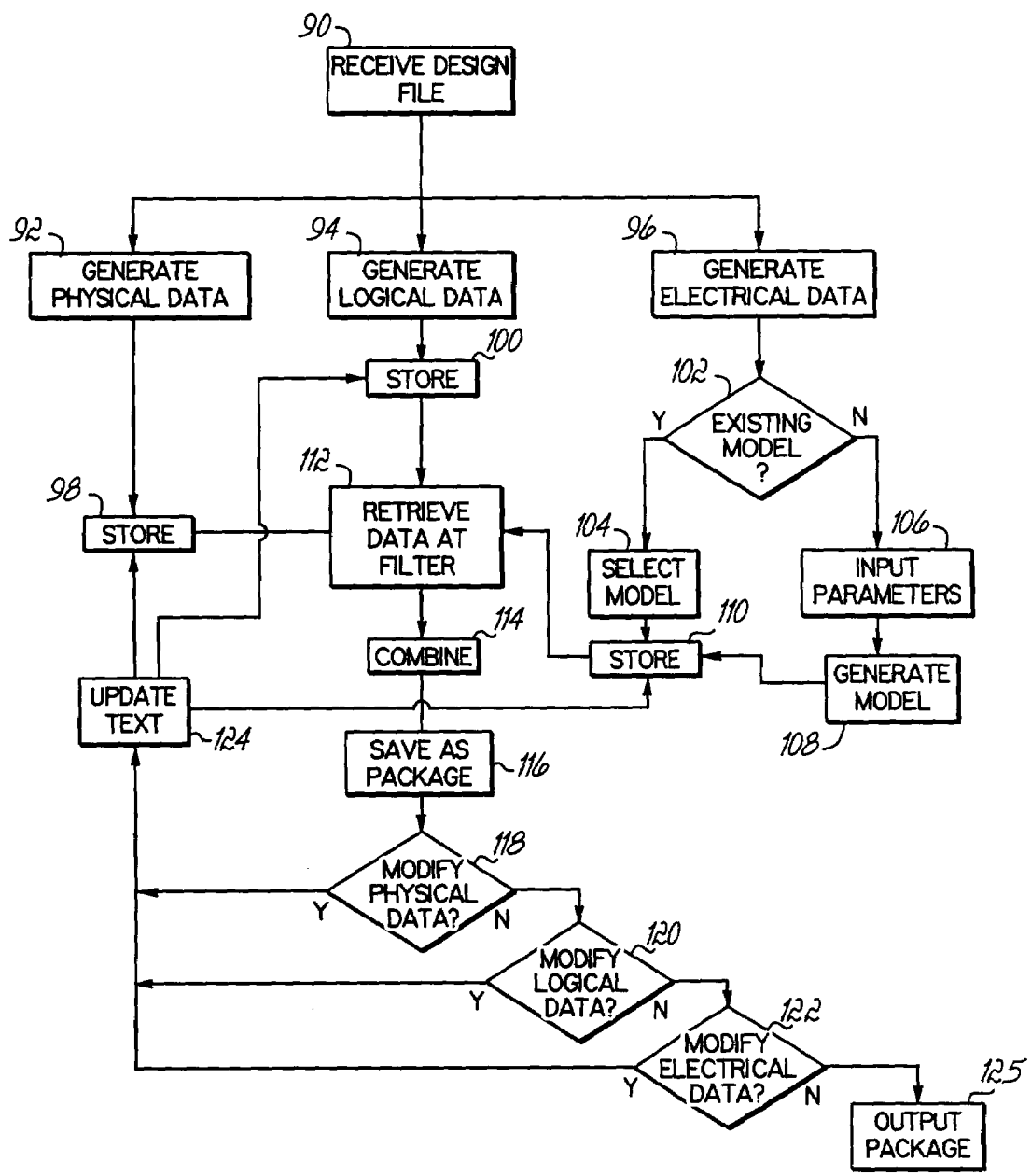
FIG. 3 is a flowchart having method steps for package file generation consistent with the invention and suited for execution within the system of FIG. 1.

FIG. 3 is a flowchart having process steps suitable for execution within the computer system 10 of FIG. 1. More particularly, the steps of FIG. 3 generate a package file configured for selective combination with other package files 44. The combined package files may comprise a net file 58 as described below. A package file for purposes of an embodiment of the present invention may include a text file having data that relates to at least a portion of a electrical circuit 70 to be analyzed. Part of that analysis may include reception at block 90 of a comprehensive design file 46 that defines the electrical circuit 70. Namely, the design file 46 may comprise data detailing the construction specifications of the design, and is typically generated using a design tool 60, such as a CAD tool. The design file 46 may be retrieved from memory 29, generated at the client computer 12, and/or be transmitted from a remote source at block 90 of FIG. 3.

Program code 62 consistent with the invention may process the design file 46 to generate parseable data files for use in generating a package file 44. Such data files may include logical data 48, physical data 50 and electrical data 52. As shown in FIG. 3, the program code creates physical data 50 at block 92, logical data 48 at block 94, and electrical data 52 at block 96. Logical data 48 generally includes text describing relative component connectivity. For instance, an exemplary logical file may identify that an expansion card 78a couples to both a bus 82a and a microchip module 74a. Physical data 50 typically includes geometric coordinates describing the precise location of components within a design. Where applicable, such coordinates of the physical data 50 may have three dimensions to account for semiconductor layers.

Electrical data 52 regards electrical attributes associated with components, wiring or other portions of a design 70 designated for analysis. Such electrical attributes may include resistance, capacitance, inductance and/or dispersion loss characteristics progammatically associated with a designated component and/or section of the design 70. As such, electrical data 52 consistent with the invention may specify an appropriate semiconductor layer and/or type of a component. Designations of a component may be accomplished using either or both logical and physical nomenclature. For instance, an inductance value may be assigned to all components having a particular identification. The electrical parameters/characteristics, themselves, may be contained in an electrical model 45 stored separately from the electrical data 52. A suitable electrical model 45 may be invoked or otherwise referenced by pointers present in the electrical data 52. In this manner, parameters of the model 45 are associated/imputed with specified components and/or design 70 portions during simulation.

As such, electrical data 52 may programmatically link to preexisting electrical models 45 having applicable electrical characteristics. As shown in FIG. 3, program code 62 consistent with the invention may determine if a model 45 having desired resistive and other electrical characteristics already exists at block 102. Where such an existing model 45 is located, the user or the program code 62 may select that model 45 at block 104 for assignment to a given package or portion of a package file. Alternatively, where a satisfactory, preexisting model 45 cannot be determined at block 102, then pertinent electrical parameters may be input by a user or retrieved from storage at block 106. Program code 62 may then process the input parameters to generate a new electrical model 45 at block 108 having the desired characteristics. In either case, the electrical data 52 may eventually be augmented by, initialize, point to, or otherwise include pertinent electrical model data 45 as selected or created at blocks 104 or 108, respectively.

As shown in FIG. 3, the physical, logical and electrical data 48–52 may be generated at blocks 92, 94 and 96, respectively. Generation for purposes of embodiments of the present invention may include sampling or otherwise extracting the data 48–52 from the design file 46. Generation may likewise include processing of the design file 46 in conjunction with user/stored input as accomplished by the program code 62. All of the data 48–52 is typically formatted for subsequent processing and storage at blocks 92, 94 and 96. One of skill in the art will recognize that other types of data consistent with the invention may be alternatively or additionally generated. Moreover, it should be appreciated that the data may be stored in one or more files at blocks 98, 100 and 110. Some files may include more than one type of data 48–52 or redundant information where advantageous. In some contexts, however, separate storage of the data at blocks 98, 100 and 110 may facilitate more focused processing and modification. Separate storage may additionally preserve the integrity of unaffected and separately stored data. As discussed herein in greater detail, such a feature can further streamline design changes by allowing a user to immediately reuse unaffected data, without having to regenerate it.

Program code 64 consistent with the invention receives the stored physical, logical and electrical data 48–52 at block 112 of FIG. 3. For instance, the program code 64 may automatically extract data from preset fields of each stored datasource 48–52. Program code 64 consistent with another embodiment of the invention may sample all or only those data fields needed in a particular analysis and/or package generation session. The program code 64 may selectively sample from the stored data 48–52 according to predetermined package generation instructions. Such instruction may come from a system configuration file 57 and/or user input. Thus, program code 64 at block 112 embodies another flexible feature that can reduce unnecessary memory and processing requirements by filtering out superfluous data. Certain embodiment consistent with the invention may further abstract data in a sequence that tracks simulation requirements. Such a feature may allow certain simulation processes to begin while package data compiles.

At block 114, program code 64 may combine or otherwise process the data 48–52 sampled at block 112 to generate a package file 44. The resultant package file 44 may comprise a single text file having necessary logical, physical and/or electrical data. By virtue of its discrete size and its selective inclusion of all necessary data, the package file 44 at block 114 may present a manageable bundle of data that retains enough data to support an independent simulation. A suitable package file 44 of another environment may include just enough data to support a simulation when combined with other package files 44 containing complementary modeling, stitching or other simulation data. Of note, information contained within the package file 44 includes at least one reference connection. An exemplary reference connection will typically comprise a geometric coordinate, such as may be included within the physical data 50. For instance, a opportunistic reference connection includes a pin connection 73a used to interconnect components. One of skill in the art, however, will appreciate that other data, to include logical data 48, may further comprise suitable reference connections. The reference connection of each package file is configured to correlate to a respective reference connection of one or more other package files.

The package file 44 may be respectively stored and output at blocks 116 and 125 of FIG. 3. The stored package file 44 may be saved in connection with an identifier, such as a package name where advantageous. The package identifier may be useful in combining packages into a net file, for instance, by providing part of a pointer address for retrieval into the net file or an editing tool. Analogous to the individual storage of the data files 48–52 at blocks 98, 100 and 110, separate storage of each package file 44 preserves the integrity of the file 44 data. Individual storage at block 116 further facilitates net file 58 stitching as discussed below. For example, where the same package is used in multiple simulations, the package can be reused without requiring regeneration. Rather, only the package file(s) 44 or package file (stitched) configuration requiring change needs to be altered, preserving work achieved in the generation of other package files.

Where a given package file 44 does need to be altered for a given simulation, the flexible, structured processes of the present invention retain useful portions of the package file 44. For instance, a user may selectively access only those aspects of the package file 44 requiring modification. Blocks 118–122 of the embodiment of FIG. 3 show method steps suited to realize such versatility consistent with the present invention. More particularly, a user may desire at block 118 to change the physical data 50 of a package. Physical data 50 previously saved as part of the package file at block 116 may need to change for a subsequent simulation. Such a need may arise out of normal design optimization processes. For instance, the user may substitute, delete and/or add a component to a package file. Another user may reassign a given component to another package file in order to streamline a given simulation scenario. As such, the user may make the necessary change to the stored physical data 50 at blocks 124 and 118. Of note, the logical and electrical data 48, 52 of the package file as stored originally at blocks 100 and 110, respectively, may be reused with the updated physical data 50 at block 112.

Alternatively or additionally, the user may similarly modify existing logical and electrical data 48, 52 of the package file 44 at blocks 120–124. As such, the user may discretely make desired changes to respective portions of the text files without compromising data that the user wishes to remain unchanged. While the sequence of steps shown in FIG. 3 may be advantageous for a given application, one of skill in the art will appreciate that embodiments consistent with the present invention may alter the order of any of the steps of the flowchart of FIG. 3 or of those that follow. Moreover, a step may be added and/or deleted in accordance with the underlying principles of the present invention.

The steps of FIG. 3 may be accomplished for a plurality of package files as dictated by an applicable net, simulation and/or design 70 configuration. The plurality of package files may be stored within the database 44 of FIG. 1 in such a manner as to be accessible by program code 42 consistent with the invention. As such, program code 42 may retrieve or otherwise receive package files at block 130 of FIG. 4. Each package file comprises a portion of a (net) design 70 to be analyzed. Each package file may further comprise independent logical, physical and electrical data 48–52, to include at least one reference connection as discussed herein. For processing considerations, package data as shown at block 130 may include only partially generated package files. That is, the system 10 may initially abstract only that data that is necessary to begin a simulation process. This feature may further streamline simulation processes that otherwise might be delayed.

A user may use a configuration file 57 to stipulate which of the package files are to be included within a given simulation/net. An exemplary configuration file 57 may include text having a programmatic instruction that directs program code 42 to selectively stitch at block 134. As such, the program code 42 may receive and process the configuration file 57 at block 132 of FIG. 4. As discussed below in greater detail in the text that describes FIG. 5, the program code 42 may select package files delineated in the received configuration file 57. More particularly, the program code 42 may determine from the configuration file 57 which of and how the package files are to be connected to form a composite, net file.

The program code 42 then stitches designated package files together using connective points of each package file. For instance, the program code may link the package files using common connective pins. Pin matching assignments may be predetermined per the configuration file 57. Alternatively, the program code 42 may automatically match connective points for each package based on preset connection rules. Such rules may account for geographic vicinity of connective points, component type, component material or virutually any other discemable feature of respective package files.

By virtue of the prior generation and separate storage of each package file in the database 44, stitching is accomplished without having to re-accomplish package creation. Furthermore, changes to the configuration file 57 made at block 158 may readily substitute, add and/or delete existing package files as required for subsequent simulations.

The stitched package files at block 134 comprise a net file. Net files may be stored at block 137 of FIG. 4 within a database 58 for future use. Where advantageous, program code 42 may format the stored net file according to modeling tool/simulator 68 specifications. Again, while the net file need not include text, a text file may lend particular application to smooth formatting and conversion during subsequent processing. In any case, the simulator 68 may receive and process the net file at blocks 138–144, respectively. Such processing may include identification of electrical models from the data contained within the net file. Electrical models linked to text of the net file may be retrieved, sampled or otherwise applied at block 142. As discussed above, the referenced electrical models impute resistance and dispersion loss characteristics to applicable portions of the net file. The simulator 68 then models travel of a signal from a driver to a receiver. Simulation of the net file may be accomplished at block 144 according to any known modeling technique. Thus, features of the present invention may apply to and enhance conventional modeling practices and mechanisms.

Exemplary output of a simulation may include one or more waveforms at block 146. Post-processing of the waveform at block 148 may be accomplished by flexible program code 69. The program code 69 may be configured to determine a desired characteristic from the waveform of block 146. For instance, the program code 69 may determine noise characteristics at block 150, and/or timing information at block 152 from an analog waveform. Noise determinations may regard predicted static, signal interference or loss dispersion encountered as a signal travels through design components and connections. Timing regards the arrival of a signal at a given component within a predetermined window of time. While such performance factors may be of particular interest to system designers of one application, one of skill in the art will appreciate that other modeling characteristics may alternatively and/or additionally be output subsequent to block 148 by analyzing waveforms output at block 146 in accordance with the principles of the present invention. In any case, reports reflecting such analysis may be stored at block 154 for future use, to include comparison and combination with other reports.

It may be necessary for a user to run multiple simulations using varying net files in order to optimize a given design. Processes consistent with the present invention facilitate such analysis by allowing the user to make changes to the net file at blocks 156 and 158. Such changes may relate to package file configuration and other modeling parameters known by those of skill in the art. Where advantageous, textual changes may be made directly to the configuration file 57 at block 158. In this manner, a user may substitute, add and/or delete text from the net file as required for subsequent simulations. New net files may thus be realized without having to re-accomplish other aspects of net file creation. New net files may be saved under new file names at block 137.

FIG. 5 is a flowchart having exemplary, sequenced steps that are relevant to the stitching processes of block 134 of FIG. 4. Programmatic stitching may begin with processing of the configuration file 57 at block 162 of FIG. 5. The configuration file 57 includes information describing which package files are to be combined in order to create a given net file. Program code 42 may retrieve those package files from a database 44 at block 163 that are designated within the configuration file 57. Program code 42 of one embodiment consistent with the invention locates reference connections of each, retrieved package file at block 164. For instance, the program code 42 may scan each package file for connector pins 73*a* and 73*b*. In this manner, geometric coordinates for each connector pin 73*a* and 73*b* may be determined. As discussed above, suitable reference connections may include other physical and/or logical information included within a package file.

The program code 42 may correlate the located reference connections at block 166. For example, the coordinates of the connector pins 73*a* and 73*b* of the above example may be matched according to user input and/or predetermined rules. Such rules may account for logical and/or physical data included within the configuration file 57 and/or program code 42, such as physical layering and logical connectivity. As such, a single reference connection may link multiple, different package files as necessary.

At block 168, the program code 42 may stitch the package files using the reference connections. For instance, the text of respective package files may be arranged and augmented with connective, linking text within a generated net file. The resultant net file may then be output at block 170 for subsequent storage, formatting and/or simulation. One of skill in the art will appreciate that respective net files may be stitched using process steps similar to those shown in FIG. 5.

While the present invention has been illustrated by a description of various embodiments, and while these embodiments have been described in considerable detail, it is not the intention of the applicants to restrict or in any way limit the scope of the appended claims to such detail. For instance, while the exemplary sequence of steps shown in FIGS. 3–5 may have particular utility in certain contexts, it should be understood that the order of such steps may be rearranged and/or modified to suit different design requirements. Additional advantages and modifications will readily appear to those skilled in the art. For instance, while embodiments of the present invention analyze noise and timing parameters with particular effectiveness, one of skill in the art will appreciate that other design performance parameters may be analyzed using methods that are consistent with the underlying principles of the present invention. Thus, the invention in its broader aspects is therefore not limited to the specific details, representative apparatus and method, and illustrative example shown and described. Accordingly, departures may be made from such details without departing from the spirit or scope of the applicants' general inventive concept.

What is claimed is:

1. A method for analyzing performance of an electrical design, comprising:
   receiving a plurality of package files, wherein each package file is descriptive of an electrical attribute associated with a plurality of components of the electrical design and defines a reference connection;
   logically linking first and second package files of the plurality of package files by correlating respective reference connections of each of the first and second package files; and
   modeling travel of an electrical signal using the logically linked first and second package files to determine a performance characteristic of the electrical design.

2. The method of claim 1, further comprising determining a second performance characteristic by selectively modifying contents of the first package file while preserving contents of the second package file.

3. The method of claim 1, wherein selectively and logically linking the first and the second package files further includes linking the first and the second package files according to configuration file instructions.

4. The method of claim 1, wherein receiving the plurality of package files further includes generating the package files from a group of data consisting of at least one of: logical data, physical data and electrical data.

5. The method of claim 1, further comprising separately storing each package file.

6. The method of claim 1, wherein selectively and logically linking the first and the second package files further includes generating a net file having characteristics of both the first and the second package files.

7. The method of claim 6, further comprising selectively and logically linking the net file with another net file.

8. The method of claim 1, wherein receiving the plurality of package files further includes receiving an incomplete package file.

9. The method of claim 1, wherein correlating respective reference connections of each of the first and second package files further includes correlating a connection selected from a group consisting of at least one of: a connection pin, another physical data point, a logical data point and an electrical data point.

10. The method of claim 1, further comprising assigning an electrical characteristic to a portion of the first package file.

11. The method of claim 1, further comprising selectively modifying a portion of the first package file while preserving a remaining portion of the first package file.

12. The method of claim 1, wherein correlating respective reference connections of each of the first and second package files further includes programmatically locating the reference connections.

13. The method of claim 1, wherein modeling the travel of the electrical signal using processing the logically linked first and second package files further includes generating an output selected from a group consisting of at least one of: an analog waveform, noise data and timing data.

14. The method of claim 1, further comprising using the first package file in a subsequent simulation.

15. An apparatus, comprising:
   a memory;
   a database resident in the memory, the database storing a plurality of package files, each package file of the plurality of package files being descriptive of an electrical attribute associated with a plurality of components of an electrical design and having a reference connection correlating to a respective reference connection of another package file of the plurality; and
   a program for selectively stitching first and second package files of the plurality of package files by correlating the respective reference connections of the first and second package files; the program being further configured to initiate modeling travel of an electrical signal using the stitched first and second package files to determine a performance characteristic of the electrical design.

16. The apparatus of claim 15, wherein the program initiates determining a second performance characteristic by selectively modifying contents of the first package file while preserving contents of the second package file.

17. The apparatus of claim 15, wherein the program initiates stitching the first and the second package files according to configuration file instructions.

18. The apparatus of claim 15, wherein the program initiates generating the plurality of package files from a group of data consisting of at least one of: logical data, physical data and electrical data.

19. The apparatus of claim 15, wherein the program initiates separately storing each package file.

20. The apparatus of claim 15, wherein the program initiates generating a net file having characteristics of both the first and the second package flies.

21. The apparatus of claim 20, wherein the program initiates selectively and logically linking the net file with another net file.

22. The apparatus of claim 15, wherein the generation of the first package file is incomplete as the modeling initiates.

23. The apparatus of claim 15, wherein the program initiates correlating a connection selected from a group consisting of at least one of: a connection pin, another physical data point, a logical data point and an electrical data point.

24. The apparatus of claim 15, wherein the program initiates assigning an electrical model to a portion of the first package file.

25. The apparatus of claim 15, wherein the program initiates selectively modifying a portion of the first package file while preserving a remaining portion of the first package file.

26. The apparatus of claim 15, wherein the program automatically initiates locating the reference connections.

27. The apparatus of claim 15, wherein the program initiates locating the reference connections according to user input.

28. The apparatus of claim 15, wherein the program initiates generating an output selected from a group consisting of at least one of: an analog waveform, noise data and timing data.

29. The apparatus of claim 15, wherein the program initiates reusing the first package file in a subsequent simulation.

30. A program product, comprising:
a program configured to selectively stitch first and second package files of a plurality of package files by correlating respective reference connections of the first and second package files, wherein each package file is descriptive of an electrical attribute associated with a plurality of components of an electrical design; the program being further configured to initiate modeling travel of an electrical signal using the stitched first and second package files to determine a performance characteristic of the electrical design; and a signal bearing medium bearing the program.

31. The program product of claim 30, wherein the signal bearing medium includes at least one of a recordable medium and a transmission-type medium.

* * * * *